(12) United States Patent
Fournel

(10) Patent No.: US 6,480,040 B2
(45) Date of Patent: Nov. 12, 2002

(54) DEVICE FOR THE DETECTION OF A HIGH VOLTAGE GREATER THAN A SUPPLY VOLTAGE

(75) Inventor: Richard Fournel, Lumbin (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/727,299

(22) Filed: Nov. 30, 2000

(65) Prior Publication Data

US 2001/0015661 A1 Aug. 23, 2001

(30) Foreign Application Priority Data

Nov. 30, 1999 (FR) .............................. 99 15113

(51) Int. Cl.[7] ................................................ H03K 5/22
(52) U.S. Cl. ........................................... 327/77; 327/81
(58) Field of Search ................................ 327/77, 80, 81, 327/85, 87, 88, 143

(56) References Cited

U.S. PATENT DOCUMENTS 5,617,048 A * 4/1997 Ward et al. ................. 327/143
5,644,215 A   7/1997 Casper ....................... 323/274
5,747,978 A * 5/1998 Gariboldi et al. ............ 323/313
5,929,673 A * 7/1999 Haigis et al. ................ 327/143
6,147,516 A * 11/2000 Chang ........................ 327/143

FOREIGN PATENT DOCUMENTS

| EP | 0626581 | 11/1994 |
| EP | 0788231 | 8/1997 |
| EP | 0798565 | 10/1997 |

* cited by examiner

Primary Examiner—Kenneth B. Wells
(74) Attorney, Agent, or Firm—Lisa K. Jorgenson; Allen, Dyer, Doppelt, Milbrath & Gilchrist, P.A.

(57) ABSTRACT

A device for detecting the application of a high voltage signal to an internal node of an integrated circuit includes a high-voltage divider circuit and a threshold detection circuit. The threshold detection circuit receives a signal given by the output of the divider circuit, and provides a threshold crossing detection signal at an output thereof based upon the signal crossing a threshold. The detection circuit is connected between the logic supply voltage and ground, and further includes a negative feedback loop. The negative feedback loop is connected to the output of the divider circuit to limit the voltage build-up of the high voltage signal at the output thereof after the crossing of the detection threshold by the signal.

37 Claims, 3 Drawing Sheets

DEVICE FOR THE DETECTION OF A HIGH VOLTAGE GREATER THAN A SUPPLY VOLTAGE

FIELD OF THE INVENTION

The present invention relates to a device for the detection of a high voltage. The device can be applied especially to integrated circuits comprising electrically programmable non-volatile memory elements.

BACKGROUND OF THE INVENTION

The programming of non-volatile memory elements requires the use of a high voltage. For example, for an integrated circuit supplied at 2.5 volts, this high voltage reaches about 8 volts. In certain circuits, this high voltage is generated internally using a charge pump.

In other circuits, this high voltage is applied to an external pin of the integrated circuit. In this case, the customer specification for the integrated circuit gives indications on the required characteristics of this voltage. These characteristics include a nominal value, a range of values around the nominal value, and a timing window of application of this high voltage before internal use. For example, the client specification may indicate that the high voltage has a nominal value of 8 volts in a range of 7.5 to 9 volts, and must be applied in a timing window of 500 nanoseconds to 1 millisecond before it is effectively used internally. The user seeking, for example, write access to a memory element must follow a certain timing sequence to send a write command with the address and the data to be written, and to apply the high voltage.

With respect to the integrated circuit, there is a timing window for the external application of the high voltage. It is known that the high voltage is applied during this window but the instant at which it is applied is not known. Furthermore, the slope at which this high voltage is applied is not known. If the voltage build-up slope is very steep, the high voltage is applied with excessive suddenness to the MOS transistors of the circuit. This may cause the transistors to breakdown. If it is too slow, there is a risk that the high voltage will be used outside the specified value range. This may lead to a loss of information, i.e., a wrong writing.

SUMMARY OF THE INVENTION

In view of the foregoing background, it is an object of the present invention to detect the application of a high voltage to an integrated circuit to enable use of this high voltage in a manner that is optimal for the integrated circuit. An optimal use of the integrated circuit may particularly include the regeneration of an adapted high-voltage ramp, or the control of the application of this high voltage to circuits with an optimal value.

The invention can equally be applied to the case where the high voltage is generated internally. The detection of the application on an internal node enables the generation of the sequencing signals as a function of the effective level attained by the high voltage. This makes it possible to carry out the independent sequencing of parameters affecting the operation of the charge pump.

Another object of the present invention is to detect the presence of the high voltage so as to put the reference voltage generators into operation, thus enabling a reduction in the stress on the MOS transistors.

These and other objects, features and advantages in accordance with the present invention are provided by a high voltage detection device capable of detecting the crossing of a threshold on a signal given by a high-voltage divider comprising a voltage detection circuit connected between the logic supply voltage and ground. The device further comprises a negative feedback loop to limit the voltage at the output of the divider after the crossing of the threshold. The detection circuit operates in a range of logic voltage levels, thus enabling the use of standard transistors.

The invention therefore relates to a device for detecting the application of a high voltage to an internal node of an integrated circuit. The device comprises a high-voltage divider circuit and a threshold detection circuit receiving a signal at an input given by the output node of the divider circuit, and providing a threshold crossing detection signal at an output of the threshold detection circuit.

The detection circuit is preferably a circuit connected between the logic supply voltage and ground. The detection device furthermore comprises a negative feedback loop at an output of the divider circuit to limit the voltage build-up at the output node of the divider circuit after the crossing of the detection threshold.

BRIEF DESCRIPTION OF THE DRAWINGS

Other features and advantages of the invention shall be described in detail in the following description made by way of a non-restrictive indication with reference to the appended drawings, of which.

DETAILED DESCRIPTION OF THE PREFERRED EMBODIMENTS

Figure 1:
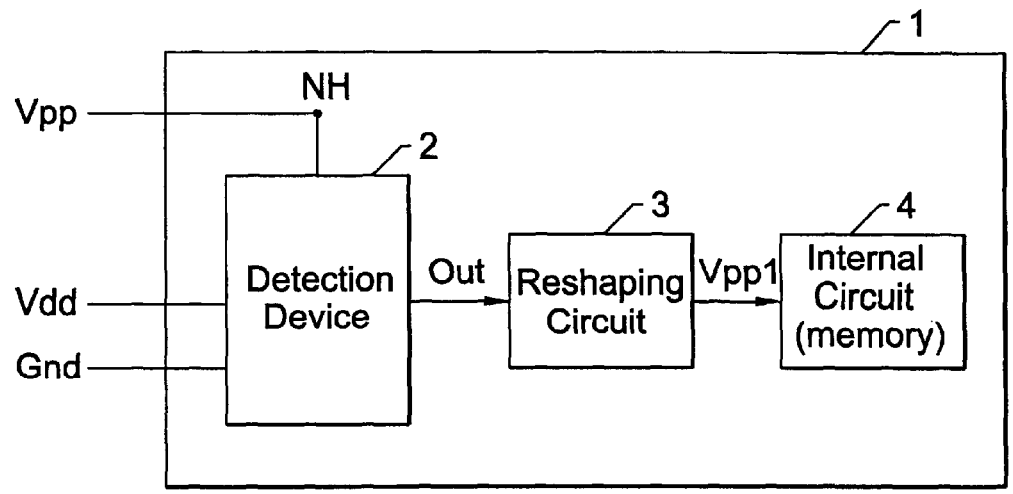
FIG. 1 shows a general block diagram of a device according to the present invention.

FIG. 1 shows an integrated circuit 1 comprising a detection device 2 according to the present invention. This integrated circuit receives at external terminals, for example, the logic supply voltages Vdd and Gnd and a high voltage Vpp. These voltages are applied to the detection device 2 to detect the application of the high voltage Vpp. This detection device gives a detection signal Out.

The detection signal is applied in the example to a reshaping and selector switch device 3. The reshaping and selector switch device 3 provides a modified programming voltage Vpp1 to the circuit systems or internal circuits 4 of the integrated circuit at the output when the detection signal Out is activated. For example, these internal circuits may include decoders associated with a non-volatile memory to program or erase cells of this memory.

The detection device according to the invention is designed to detect the crossing of a voltage threshold of the signal Vpp. This indicates the voltage build-up at an internal high-voltage node NH corresponding to the application of the high voltage Vpp to an external pin of the integrated circuit or by an internal charge pump device. If the voltage is applied with an external pin, as shown in FIG. 1, a protection circuit against electrostatic discharges (not shown) is generally designed and connected in the vicinity of this pin. In particular, the protection circuit is between the pin and the high-voltage node NH.

According to the invention, this detection does not use a reference voltage based on this high voltage but a high-voltage divider to give a signal that progresses in the range of logic voltage levels to a threshold detection circuit. The threshold detection circuit may typically be an inverter. In this way, the detection circuit is made using standard transistors. For this purpose, the device is complemented by a negative feedback loop activated by the crossing of the output threshold of the divider to limit the voltage build-up at this output.

Figure 2:
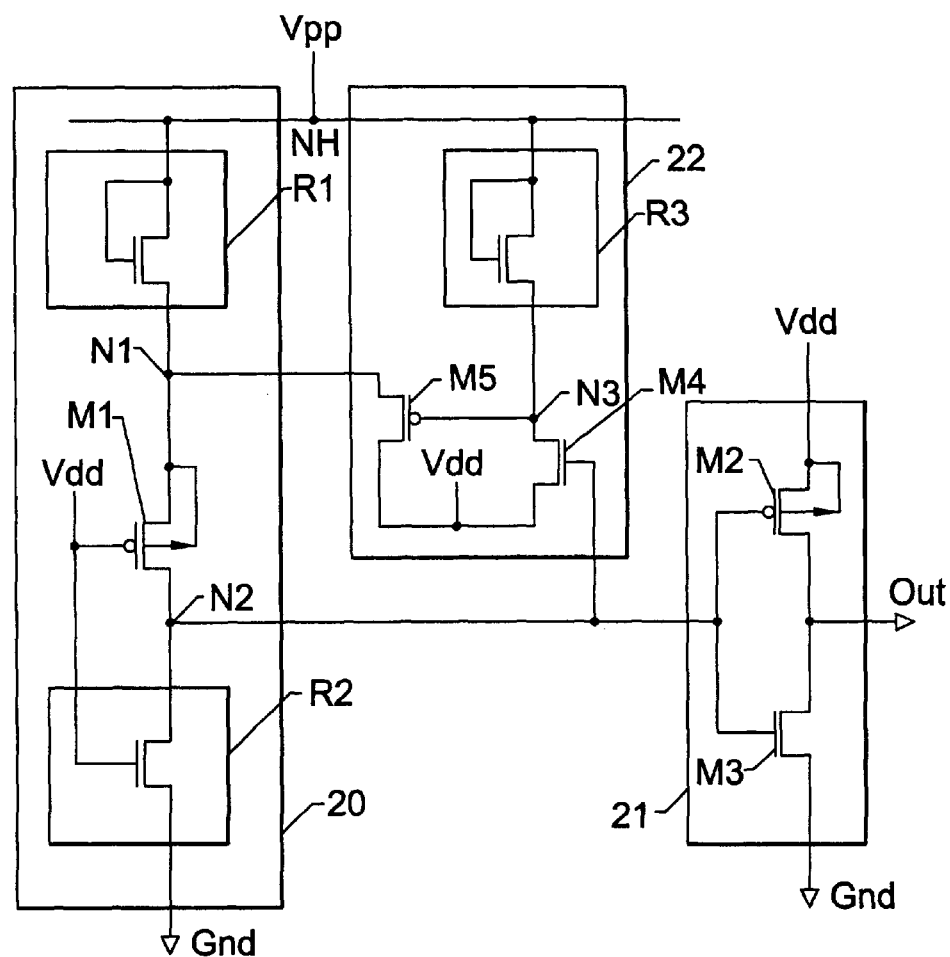
FIG. 2 shows a detailed diagram of a first embodiment of the present invention.

FIG. 2 shows a first embodiment of a detection device according to the present invention using CMOS technology. The invention is not restricted to an embodiment using this technology. The detection device shown in FIG. 2 has a divider circuit 20 for the division of the high voltage Vpp. This circuit 20 is connected between a high-voltage node NH and ground Gnd. An output node N2 of this divider gives a signal applied to a threshold detection circuit 21. The illustrated threshold detection circuit 21 in the example is an inverter. The invention is not restricted in this exemplary embodiment to the threshold detection circuit which, in another example not shown, could be based on a band-gap type circuit.

The signal given by the output node N2 of the divider circuit is applied to the input of a negative feedback loop 22 to limit the voltage build-up at the output node N2 after the crossing of the detection threshold. The divider circuit 20 comprises a first resistive element R1, a transistor M1 and a second resistive element R2. The first resistive element R1 is connected between the high-voltage node NH and a first internal node N1. The transistor M1 is connected between the internal node N1 and the output node N2. The gate of transistor M1 is biased by the logic supply voltage Vdd. The second resistive element R2 is connected between the output node N2 and ground Gnd.

In the example, the transistor M1 is a P-type MOS transistor. The first resistive element R1 and the second resistive element R2 are capable of withstanding high voltage. Depending on the application and the technology considered, they will be made polysilicon, N-type wells and N-type or P-type MOS transistors. In the example, these resistive elements R1 and R2 are each formed by an N-type MOS transistor. The transistor forming the first resistive element R1 has its drain and gate connected in common to the high-voltage node, and its source is connected to the source of the transistor M1. This transistor must be capable of withstanding high voltage.

The transistor forming the second resistive element R2 has its drain connected to the drain of the transistor M1 and its source connected to ground. Its gate is controlled by the logic supply voltage Vdd. This transistor must be capable of withstanding the high voltage imposed between its drain and its source by the output node N2. The transistor M1 has its gate controlled by the logic supply voltage Vdd. Its bulk or body is preferably connected to its source.

In the example, the detection circuit 21 has a CMOS type inverter. This inverter comprises a P-type MOS transistor M2 and an N-type MOS transistor M3 series-connected between the logic supply voltage Vdd and ground. The gates of these transistors are connected in common, and to the output node N2 of the input stage. Their sources are connected in common for providing the detection signal Out of the detection device.

The internal node N1 of the divider circuit, between the first resistive element R and the transistor M1, is controlled by the negative feedback loop 22 when it is activated. This negative feedback loop comprises a resistive element R3, and first and second transistors M4 and M5. The resistive element R3 is connected between the high-voltage node NH and an internal node N3. The first transistor M4 is connected between this internal node N3 and the logic supply voltage Vdd. The second transistor M5 is connected between the node N1 of the divider circuit and the logic supply voltage Vdd.

The first transistor M4 is, in the example, an N-type MOS transistor whose gate is controlled by the signal given by the output node N2 of the divider circuit. The second transistor M5 is, in the example, a P-type MOS transistor whose gate is connected by the internal node N3 of the loop. The bulk of this P-type transistor is connected with its source to the internal node N1 of the divider circuit 20.

Just like the resistive elements R1 and R2, the resistive element R3 is an element capable of withstanding high voltage. It may be made of polysilicon and may be formed by an N-type well or by an N-type or P-type MOS transistor. In the example, the resistive element R3 is formed by an N-type MOS transistor whose gate is connected to its drain. In the example, the resistors are SN-type MOS transistors. However, they could also be high-voltage P-type MOS transistors.

Figure 3:
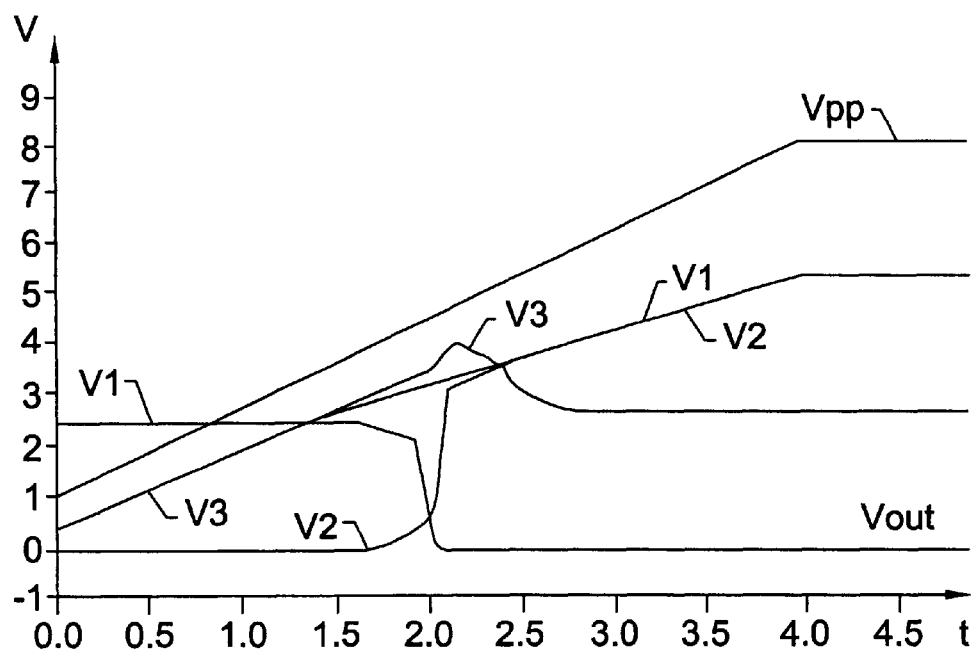
FIG. 3 is a timing diagram of the voltage changes experienced by the different signals in the device shown in FIG. 2.

The operation of a device such as this will now be explained with reference to the timing diagram shown in FIG. 3. FIG. 3 shows the progress of the voltage at different points of the device with the build-up of the high voltage Vpp. Thus, the figure more particularly shows the voltages V1 and V2 at the nodes N1 and N2 of the divider circuit, the voltage Vout at the output Out of the device, and the voltage V3 at the node N3 of the negative feedback loop.

The operation is as follows. At the outset, when the high voltage Vpp is not applied to the high-voltage node, the output node N2 is held at ground by the resistive element R2. The node N3 is also at ground. Since this node N3 controls the gate of the transistor M5, which is a PMOS transistor, the transistor draws the node N1 to Vdd.

The high voltage is applied to the high-voltage node NH. The voltage rises at this high-voltage node NH. The internal node N1 of the divider circuit follows this voltage build-up. As soon as the voltage at the internal node N1 becomes higher than the logic supply voltage Vdd plus the threshold voltage of the transistor M1, the transistor M1 becomes conductive.

The output node N2 (the drain of the transistor M1) then follows the voltage build-up of the internal node N1 (the source of the transistor M1). If the voltage V2 at this output node N2 exceeds the logic supply voltage Vdd plus the threshold voltage of the transistor M4 of the negative feedback loop 22, this transistor M4 becomes conductive. This causes the drawing of the internal node N3 (its drain) to Vdd (source voltage). Consequently, the second transistor M5 of the negative feedback loop is made conductive. This transistor, which is less resistive than the resistive element R1, limits the voltage build-up at the node N1 and, therefore, at the node N2.

It is the sizing of the resistive element R1 with respect to the transistor M5 that determines the borderline voltage on the node N1 and, therefore, the borderline voltage on the node N2. This sizing is such that the maximum high voltage attained on the node N2 is a voltage acceptable by the logic circuitry, enabling the use of a standard detection circuit.

In other words, the voltage at the output node remains in a range of logic voltage levels acceptable to the detection circuit, in this case, to the gates of the MOS transistors. In the example, for a high-voltage Vpp with a nominal value of 8 volts, this maximum value of voltage at the node N2 is in the range of 5 volts. This level is adjusted as a function of the application and the internal structure of the threshold detection circuit.

In the example corresponding to the timing diagram of FIG. 3, the detection circuit is sized to switch over at the crossing of a threshold of about 4.5 volts. The output Out of the inverter passes from 1 to 0 in the example. This passage to 0 activates, for example, the device 3 for reshaping the high-voltage signal (FIG. 1).

FIG. 3 also shows the voltage at the internal node N3 of the negative feedback loop. This internal node N3 follows, first, the voltage build-up of Vpp (resistive element R3). The powering on of the transistor M4 puts an end to this voltage build-up and brings this node to Vdd. The transistor M4 must be sized appropriately with respect to the resistive element Re so that it can draw the internal node N3 to Vdd.

The negative feedback loop is activated only after the crossing of the threshold at the output node N2. This is after the detection by the detection circuit of a switching from 0 to 1 of the signal Out because the transistor M4 conducts at Vdd+Vtn, and the threshold of the detection circuit is necessarily between 0 and Vdd.

The detection device according to the invention necessitates the use of very few high-voltage elements. The only elements concerned are the resistive elements of the device which, in the example, are formed by N-type MOS transistors. Thus, the transistor of each of the resistive elements R1 and R3 must stand up to the high voltage Vpp between a respective drain and source and a respective gate and source.

In the example, the resistive element R1 must withstand a voltage between Vpp and N1, i.e., a maximum of 3 volts, and the resistive element R2 must withstand a voltage between Vpp and N3, i.e., a maximum of 5.5 volts for Vpp at 8 volts. The transistor that forms the resistive element R2 must withstand the voltage between its drain and source, given by the maximum amplitude Vdd of 2.5 volts. For these transistors of the high-voltage type, any available type known to those skilled in the art and capable of withstanding the high voltage indicated may be used.

Figure 4:
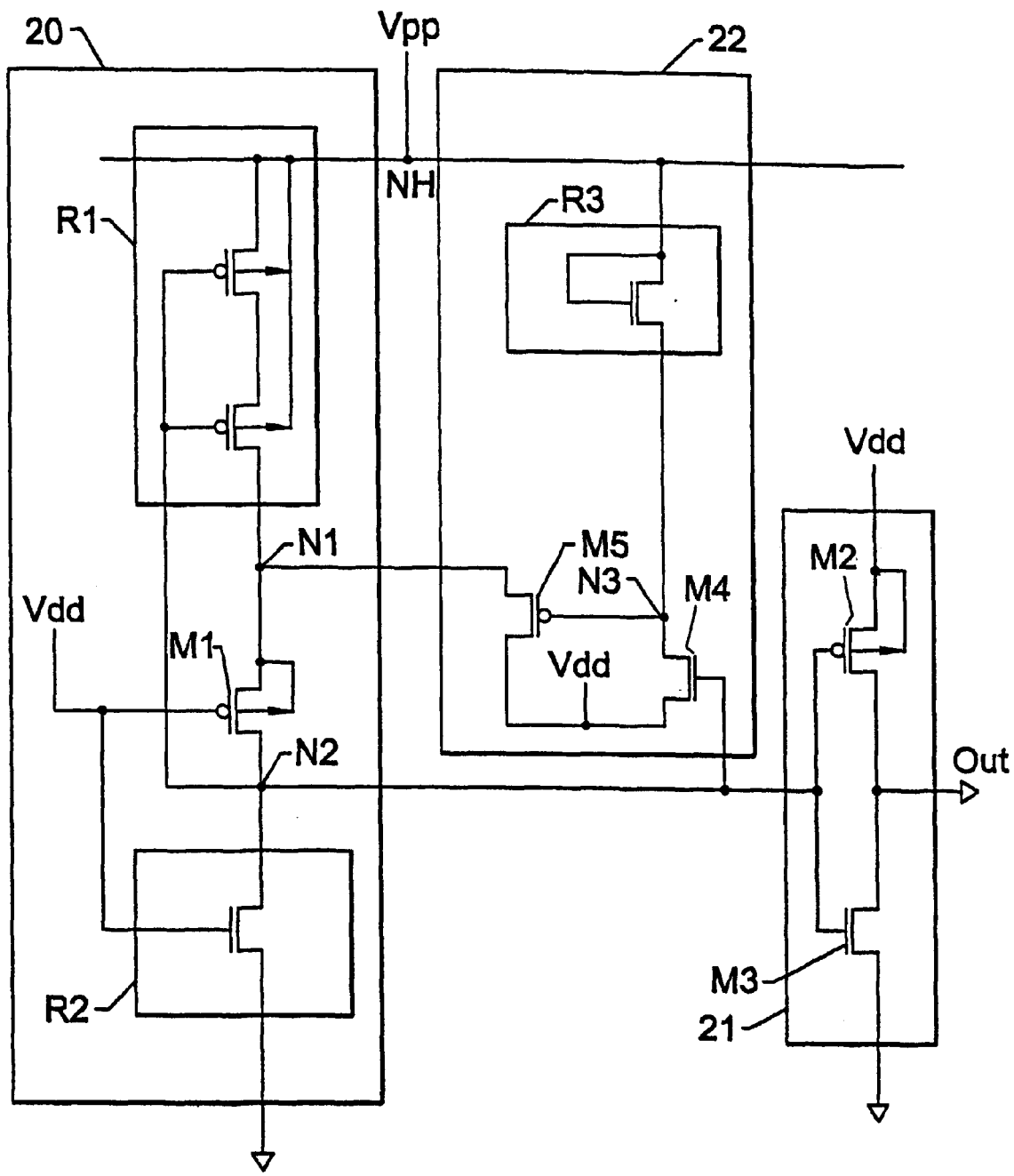
FIG. 4 is a detailed diagram of a second embodiment of the present invention.

The transistors M1, M4 and M5 and the transistors of the detection stage, for their part, are standard transistors. FIG. 4 shows a second embodiment of a detection device according to the invention. It differs from the first one in the use of at least two standard transistors controlled by the output node N2 to form the resistive element R1, so as not to have to use a transistor for receiving the high voltage. In the example, this resistive element R1 is made with two P-type MOS transistors in series, the gates of which are connected to the output node N2. The bulk of each of these transistors is connected to the high-voltage node NH.

This alternative embodiment of the resistive element R1 can be applied to the resistive element R3 (not shown). This resistive element R3 would then be formed by two standard series-connected PMOS transistors whose gates are connected to the output node N2.

Figure 5:
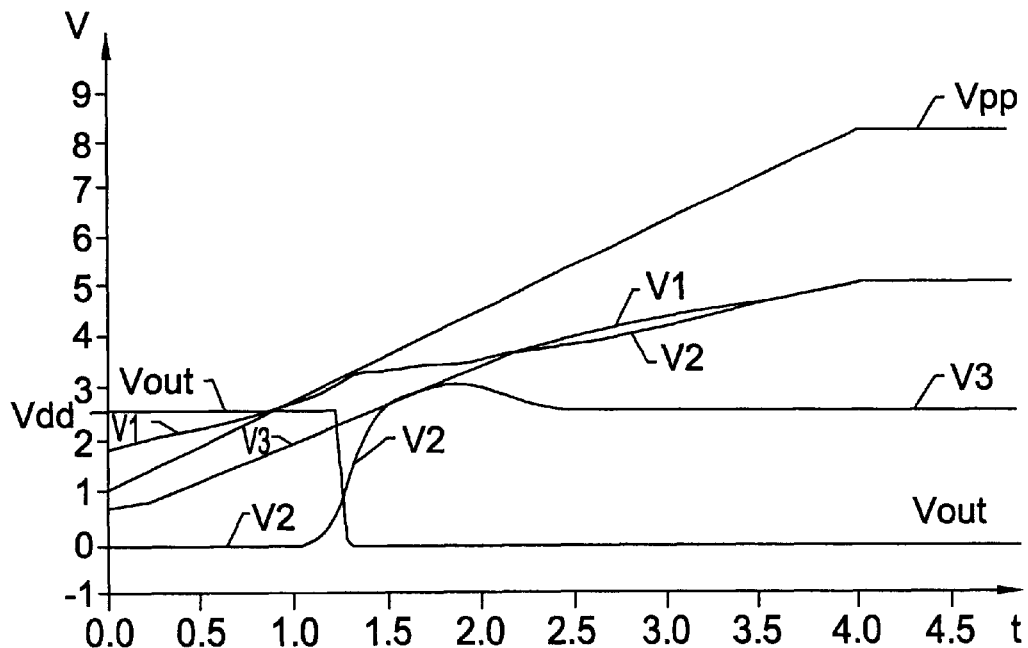
FIG. 5 is a timing diagram of the voltage changes experienced by the different signals in the device shown in FIG. 4.

The corresponding timing diagram is shown in FIG. 5. Since the other elements of the detection device are all identical, it shows a voltage build-up with the high voltage Vpp that is faster on the output node N2. This enables a faster detection. However, putting into operation of the negative feedback loop is not as quick. This is due to the gate connection of the PMOS transistors of the resistive element R1 to the output node N2, which causes the two PMOS transistors to no longer operate as resistive elements. By connecting the gates of the PMOS transistors of the resistive element R1 to the node N1, and operation closer to that of the NMOS transistor device is formed. This observation is applicable as the case may be to the resistive element R3.

That which is claimed is:

1. A detection device for detecting application of a high voltage signal to an internal node of an integrated circuit, the detection device comprising:

a high voltage divider circuit having an input connected to the internal node, and an output for providing a divided high voltage signal;

a threshold detection circuit connected between a supply voltage and ground, and having an input for receiving the divided high voltage signal, and an output for providing a threshold crossing detection signal based upon the high voltage signal crossing a threshold, the high voltage signal being greater than the supply voltage; and a negative feedback loop connected to the output of said high voltage divider circuit for limiting a voltage rise of the divided high voltage signal at the output thereof based upon the high voltage signal at the output thereof based upon the high voltage signal crossing the threshold.

2. A detection device according to claim 1, wherein said high voltage divider circuit includes a first internal node between the output thereof and the internal node of the integrated circuit, and wherein said negative feedback loop is also connected to the first internal node.

3. A detection device according to claim 2, wherein said high voltage divider circuit comprises:

a first resistive element connected between the first internal node and the internal node of the integrated circuit;

a transistor connected between the first internal node and the output of said high voltage divider, said transistor comprising a control terminal receiving the supply voltage; and a second resistive element connected between the output of said high voltage divider and ground.

4. A detection device according to claim 3, wherein said first and second resistive elements can with stand the high voltage signal.

5. A detection device according to claim 3, wherein said first resistive element comprises at least two MOS transistors connected together in series, each MOS transistor comprising a gate connected to the output of said high voltage divider circuit.

6. A detection device according to claim 1, wherein said negative feedback loop comprises:

a resistive element connected between a second internal node in said negative feedback loop and the internal node of the integrated circuit;

a first transistor connected between the second internal node and the supply voltage, said first transistor comprising a gate connected to the output of said high voltage divider circuit; and a second transistor connected between a first internal node of said high voltage divider circuit and the supply voltage, said second transistor comprising a gate connected to the second internal node.

7. A detection device according to claim 1, wherein said negative feed back loop can withstand the high voltage signal.

8. A detection device according to claim 6, wherein said resistive element of said negative feedback loop comprises at least two series-connected MOS transistors connected together in series, each MOS transistor comprising a gate connected to the output of said high voltage divider circuit.

9. A detection device according to claim 1, wherein said threshold detection circuit comprises an inverter.

10. A detection device according to claim 1, wherein at least one of said high voltage divider circuit, said threshold detection circuit, and said negative feedback loop comprises N-channel and P-channel transistors.

11. A detection device for detecting application of a signal to an integrated circuit, the detection device comprising:
   a divider circuit having an input connected to a node of the integrated circuit receiving the signal, and an output for providing a divided signal;
   a threshold detection circuit connected between a first voltage reference and a second voltage reference, and having an input for receiving the divided signal, and an output for providing a threshold crossing detection signal based upon the signal crossing a threshold, the signal being greater than each of the first and second voltage references; and
   a negative feedback loop connected to the output of said divider circuit for limiting a voltage rise of the divided signal at the output thereof based upon the signal crossing the threshold.

12. A detection device according to claim 11, wherein the first voltage reference is a supply voltage for the integrated circuit, and the second voltage reference is ground.

13. A detection device according to claim 11, wherein the node of the integrated circuit is an internal node.

14. A detection device according to claim 11, wherein the integrated circuit comprises a plurality of pins, and the node of the integrated circuit is connected to one of the plurality of pins.

15. A detection device according to claim 11, wherein said divider circuit includes a first internal node between the output thereof and the node of the integrated circuit, and wherein said negative feedback loop is also connected to the first internal node.

16. A detection device according to claim 15, wherein said divider circuit comprises:
   a first resistive element connected between the first internal node and the node of the integrated circuit;
   a transistor connected between the first internal node and the output of said divider circuit, said transistor comprising a control terminal receiving the first voltage reference; and
   a second resistive element connected between the output of said divider circuit and the second voltage reference.

17. A detection device according to claim 16, wherein said first resistive element comprises at least two MOS transistors connected together in series, each MOS transistor comprising a gate connected to the output of said divider circuit.

18. a detection device according to claim 11, wherein said negative feedback loop comprises:
   a resistive element connected between a second internal node in said negative feed back loop and the node of the integrated circuit;
   a first transistor connected between the second internal node and the first voltage reference, said first transistor comprising a gate connected to the output of said divider circuit; and
   a second transistor connected between a first internal node of said divider circuit and the first voltage reference, said second transistor comprising a gate connected to the second internal node.

19. A detection device according to claim 18, wherein said resistive element of said negative feedback loop comprises at least two series-connected MOS transistors connected together in series, each MOS transistor comprising a gate connected to the output of said divider circuit.

20. A detection device according to claim 11, wherein said threshold detection circuit comprises an inverter.

21. A detection device according to claim 11, wherein at least one of said divider circuit, said threshold detection circuit, and said negative feedback loop comprises N-channel and P-channel transistors.

22. An integrated circuit comprising:
   a node for receiving a high voltage signal;
   a detection device having an input connected to the node for detecting the high voltage signal being applied thereto, the detection device comprising
      a divider circuit having an input connected to the node, and an output for providing a divided high voltage signal,
      a threshold detection circuit connected between a first voltage reference and a second voltage reference, and having an input for receiving the divided high voltage signal, and an output for providing a threshold crossing detection signal based upon the high voltage signal crossing a threshold, the voltage signal being greater than each of the first and second voltage references, and
      a negative feedback loop connected to the output of said divider circuit for limiting voltage rise of the divided high voltage signal at the output thereof based upon the high voltage signal crossing the threshold;
   A reshaping circuit having an input for receiving the threshold crossing detection signal, and an output for providing a modified high voltage signal; and
   a memory connected to said reshaping circuit for receiving the modified high voltage signal for programming or erasing said memory.

23. An integrated circuit according to claim 22, wherein the first voltage reference is a supply voltage for the integrated circuit, and the second voltage reference is ground.

24. An integrated circuit according to claim 22, wherein the node of the integrated circuit is an internal node.

25. An integrated circuit according to claim 22, further comprising a plurality of pins, and wherein the node of the integrated circuit is connected to one of said plurality of pins.

26. An integrated circuit according to claim 22, wherein said divider circuit includes a first internal node between the output thereof and the node of the integrated circuit, and wherein said negative feedback loop is also connected to the first internal node.

27. An integrated circuit according to claim 26, wherein said divider circuit comprises:
   a first resistive element connected between the first internal node and the node of the intergrated circuit;
   a transistor connected between the first internal node and the output of said divider circuit, said transistor comprising a control terminal receiving the first voltage reference; and
   a second resistive element connected between the output of said divider circuit and the second voltage reference.

28. An integrated circuit according to claim 27, wherein said first resistive element comprises at least two MOS transistors connected together in series, each MOS transistor comprising a gate connected to the output of said divider circuit.

29. An integrated circuit according to claim 22, wherein said negative feedback loop comprises:
   a resistive element connected between a second internal node in said negative feedback loop and the node of the integrated circuit;

30. An integrated circuit according to claim 29, wherein said resistive element of said negative feedback loop comprises at least two series-connected MOS transistors connected together in series, each MOS transistor comprising a gate connected to the output of said divider circuit.

31. An integrated circuit according to claim 22, wherein said threshold detection circuit comprises an inverter.

32. A method for detecting application of a high voltage signal to an integrated circuit, the method comprising:
   dividing the high voltage signal applied to a node of the integrated circuit;
   generating a threshold crossing detection signal based upon the high voltage signal crossing a threshold, the generating being based upon using a threshold detection circuit connected between a first voltage reference and a second voltage reference, the high voltage signal being greater than each of the first and second voltage references; and
   limiting voltage rise of the divided high voltage signal using a negative feedback loop based upon the high voltage signal crossing the threshold.

33. A method according to claim 32, wherein the node of the integrated circuit is an internal node.

34. A method according to claim 32, wherein the integrated circuit comprises a plurality of pins, and the node of the integrated circuit is connected to one of the plurality of pins.

35. A method according to claim 32, wherein dividing the high voltage signal is performed using a divider circuit connected between the first voltage reference and the second voltage reference, the divider circuit including an output for providing a divided high voltage signal.

36. A method according to claim 35, wherein the divider circuit includes a first internal node between the output thereof and the node of the integrated circuit, and wherein the negative feedback loop is connected between the output and the first internal node.

37. A method according to claim 32, wherein the threshold detection circuit comprises an inverter.

* * * * *

UNITED STATES PATENT AND TRADEMARK OFFICE
CERTIFICATE OF CORRECTION

PATENT NO.    : 6,480,040 B2
DATED         : November 12, 2002
INVENTOR(S)   : Richard Fournel It is certified that error appears in the above-identified patent and that said Letters Patent is hereby corrected as shown below:

<u>Column 6,</u>
Lines 25-26, delete "at the output thereof based upon the high voltage signal"
Line 45, delete "with stand" insert -- withstand --

<u>Column 8,</u>
Line 27, delete "the voltage" insert -- the high voltage --
Line 35, delete "A" insert -- a --

Signed and Sealed this

Twenty-second Day of July, 2003

JAMES E. ROGAN
*Director of the United States Patent and Trademark Office*